US009627506B2

(12) United States Patent  
Nishi

(10) Patent No.: US 9,627,506 B2  
(45) Date of Patent: Apr. 18, 2017

(54) METHOD OF MANUFACTURING SEMICONDUCTOR DEVICE

(71) Applicant: Sumitomo Electric Device Innovations, Inc., Yokohama-shi (JP)

(72) Inventor: Masahiro Nishi, Yokohama (JP)

(73) Assignee: Sumitomo Electric Device Innovations, Inc., Yokohama-shi (JP)

(*) Notice: Subject to any disclaimer, the term of this patent is extended or adjusted under 35 U.S.C. 154(b) by 0 days.

(21) Appl. No.: 15/074,014

(22) Filed: Mar. 18, 2016

(65) Prior Publication Data

US 2016/0260818 A1 Sep. 8, 2016

Related U.S. Application Data

(62) Division of application No. 14/250,058, filed on Apr. 10, 2014, now Pat. No. 9,306,030.

(30) Foreign Application Priority Data

Apr. 12, 2013 (JP) .................. 2013-084273

(51) Int. Cl.
H01L 21/04 (2006.01)
H01L 29/417 (2006.01)
H01L 29/66 (2006.01)
H01L 29/778 (2006.01)
H01L 29/20 (2006.01)
H01L 21/308 (2006.01)

(52) U.S. Cl.
CPC .... H01L 29/66462 (2013.01); H01L 21/3081 (2013.01); H01L 29/2003 (2013.01); H01L 29/41766 (2013.01); H01L 29/7787 (2013.01)

(58) Field of Classification Search
None
See application file for complete search history.

(56) References Cited

U.S. PATENT DOCUMENTS

| | | | |
|---|---|---|---|
| 2008/0124852 A1* | 5/2008 | Ahn | H01L 21/28587 438/182 |
| 2010/0163930 A1 | 7/2010 | Kaneko | |
| 2011/0095337 A1 | 4/2011 | Sato | |
| 2013/0069116 A1 | 3/2013 | Chen et al. | |
| 2014/0077263 A1 | 3/2014 | Yoshioka et al. | |

FOREIGN PATENT DOCUMENTS

JP 2012-023213 A 2/2012

* cited by examiner

Primary Examiner — Daniel Whalen
(74) Attorney, Agent, or Firm — Venable LLP; Michael A. Sartori; Laura G. Remus

(57) ABSTRACT

A semiconductor device includes a semiconductor layer formed on a substrate, an electrode contact window that includes a recess formed on a surface of the semiconductor layer, an inner wall having a slope, and a source electrode, a drain electrode, and a gate electrode formed on the semiconductor layer, in which the drain electrode is in contact with the slope of the inner wall.

9 Claims, 7 Drawing Sheets

METHOD OF MANUFACTURING SEMICONDUCTOR DEVICE

CROSS REFERENCE TO RELATED APPLICATIONS

This application is a Divisional of U.S. patent application Ser. No. 14/250,058, filed Apr. 10, 2014, which claims the benefit of Japanese Patent Application No. 2013-084273, filed Apr. 12, 2013.

BACKGROUND OF THE INVENTION

Field of the Invention

The present invention relates to a semiconductor device using a nitride semiconductor and a method of manufacturing the same.

Related Background Art

A semiconductor device using a nitride semiconductor is used as a power device or the like which operates at high frequency and at high output power. In particular, as a semiconductor device suitable for amplification in a high-frequency band, such as a microwave, a quasi-millimeter wave, and a millimeter wave, for example, a field effect transistor (FET) of a high electron mobility transistor (HEMT) or the like is known.

Japanese Unexamined Patent Application Publication No. 2012-23213 discloses a field effect transistor in which a part of a nitride semiconductor layer is removed (recessed) and a gate electrode and an ohmic electrode (source electrode and drain electrode) are formed on the nitride semiconductor layer.

SUMMARY OF THE INVENTION

In the case that a high voltage operation is performed in the semiconductor device using the nitride semiconductor, electric field concentration occurs in the end portions of the ohmic electrodes, and a high electric field is generated. In this case, reliability of the apparatus may be decreased by electrical conduction destruction, and the characteristics of the apparatus may be changed by current collapse.

A semiconductor device according to an aspect of the invention includes a semiconductor layer formed on a substrate, an electrode contact window that includes an inner wall formed on a surface of the semiconductor layer, the inner wall having a forward tapered shape, and a source electrode, a drain electrode, and a gate electrode formed on the semiconductor layer, in which the drain electrode is in contact with the inner wall of the electrode contact window.

In the above configuration, the drain electrode may extend to a top surface of the semiconductor layer.

In the above configuration, the semiconductor layer may have an electron transit layer, an electron supply layer, and a cap layer, and the electron supply layer and the cap layer may be exposed on the inner wall of the electrode contact window.

In the above configuration, the drain electrode may be formed to extend to the cap layer exposed on the inner wall.

In the above configuration, the semiconductor layer may include a nitride semiconductor layer.

In the above configuration, a width of the inner wall in a direction horizontal to a surface of the substrate may be equal to or greater than 0.03 μm and equal to or smaller than 0.1 μm.

A method of manufacturing a semiconductor device according to another aspect of the invention includes forming a semiconductor layer on a substrate, forming an electrode contact window on the surface of the semiconductor layer to include an inner wall having a forward tapered shape, and forming a source electrode, a drain electrode, and a gate electrode on the semiconductor layer, in which the forming of the drain electrode is performed in a pattern such that the drain electrode is in contact with the inner wall of the electrode contact window.

In the above configuration, the forming of the electrode contact window may include forming a resist having an opening pattern corresponding to the electrode contact window on the semiconductor layer, and performing isotropic etching on the semiconductor layer through the opening or performing isotropic etching on the semiconductor layer through the opening after performing anisotropic etching on the semiconductor layer through the opening.

In the above configuration, the forming of the resist may form a first resist and a second resist on the semiconductor layer in this order, and the opening of the first resist may be greater than the opening of the second resist.

According to the invention, in the semiconductor device using the nitride semiconductor, it is possible to suppress failure due to a high electric field generated on the ohmic electrodes and to improve apparatus characteristics and reliability.

DESCRIPTION OF THE PREFERRED EMBODIMENTS

Example 1

Figure 1A:
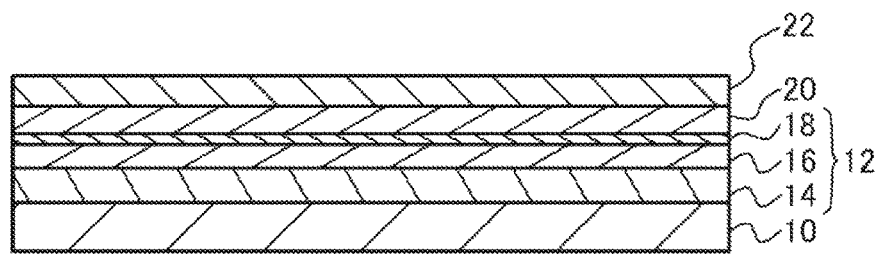
FIGS. 1A to 1D are diagrams (first view) showing a process for manufacturing a semiconductor device according to Example 1.

FIGS. 1A to 2D are diagrams showing a process for manufacturing a semiconductor device according to Example 1 of an aspect of this invention. As shown in FIG. 1A, a nitride semiconductor layer 12 is formed on a substrate 10 using a MOCVD (Metal Organic Chemical Vapor Deposition) method. As the substrate 10, for example, a SiC substrate having a (0001) principal surface can be used. The nitride semiconductor layer 12 is formed by laminating a first nitride semiconductor layer 14, a second nitride semiconductor layer 16, and a third nitride semiconductor layer 18 in this order. The nitride semiconductor layer 12 may include a doping region containing dopant. For example, Si or the like can be used as the dopant.

The first nitride semiconductor layer 14 is a layer including an electron transit layer, and can be formed of, for example, non-doped gallium nitride (GaN) layer having a thickness of 1000 nm. The first nitride semiconductor layer 14 may include a buffer layer in addition to the electron transit layer. As the typical buffer layer, for example, an aluminum nitride (AlN) layer which is located at the interface between the first nitride semiconductor layer 14 and the substrate 10 is considered. The second nitride semiconductor layer 16 is a layer including an electron supply layer, and can be formed of, for example, n-type aluminum gallium nitride (AlGaN) layer or n-type indium aluminum nitride (InAlN) layer having a thickness of 20 nm. The second nitride semiconductor layer 16 may include a spacer layer in addition to the electron supply layer. As the typical spacer layer, for example, a non-doped aluminum nitride (AlN) layer which is located at the interface between the second nitride semiconductor layer 16 and the electron transit layer is considered. The third nitride semiconductor layer 18 is a cap layer, and can be formed of, for example, n-type gallium nitride (GaN) layer having a thickness of 5 nm.

Next, as shown in FIG. 1A, two-layered resist (first resist 20 and second resist 22) are formed on the nitride semiconductor layer 12 in this order. In this example, although photoresist is used as the first resist 20 and the second resist 22, as described below, other mask materials may be used.

Figure 1B:
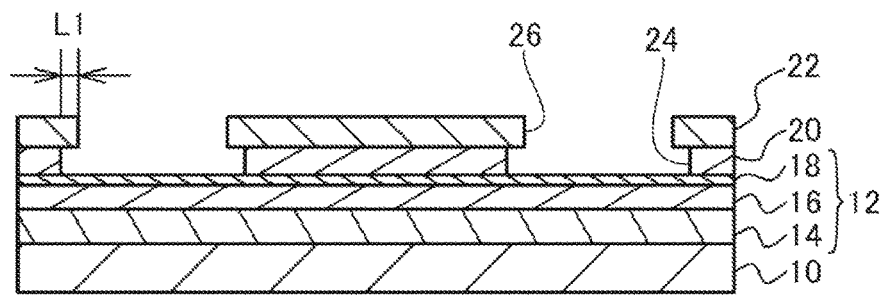

Next, as shown in FIG. 1B, the first resist 20 and the second resist 22 are exposed, a first opening pattern 24 is formed in the first resist 20, and a second opening pattern 26 is formed in the second resist 22. At this time, the size of the first opening pattern 24 is set to be greater than the second opening pattern 26. In obtaining this overhang shape, for example, a method which uses high-sensitivity resist as the first resist 20 and uses low-sensitivity resist as the second resist 22 is known. In regard to the thickness of the resist, as the first resist 20, for example, photoresist having a thickness of 0.3 µm to 1 µm can be used. As the second resist 22, for example, photoresist having a thickness of 1 µm can be used. The length (L1 in the drawing) of a protruding portion of the second resist 22 from the first resist 20 can be set to, for example, 0.3 µm to 1 µm.

Figure 1C:
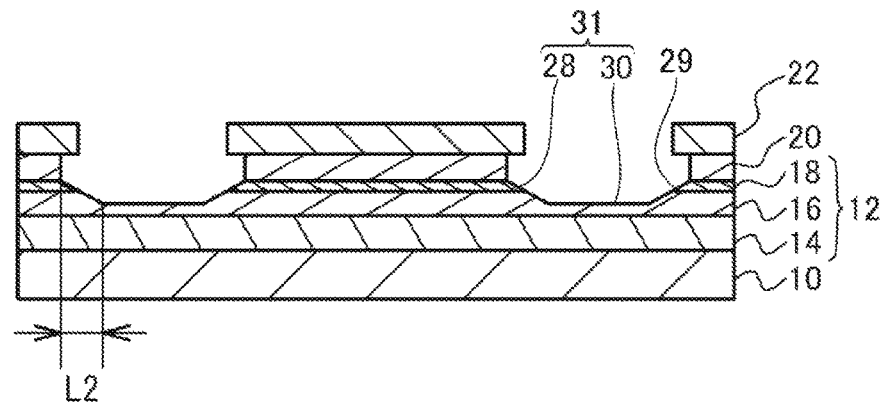

Next, as shown in FIG. 1C, a part of the nitride semiconductor layer 12 is etched with the first resist 20 and the second resist 22 as a mask. Etching is performed to pass through the third nitride semiconductor layer 18 and to reach the middle of the second nitride semiconductor layer 16 without reaching the first nitride semiconductor layer 14. Accordingly, an opening 28 is formed in the third nitride semiconductor layer 18, and a concave portion 30 is formed in the second nitride semiconductor layer 16. The opening 28 and the concave portion 30 form an electrode contact window 31 where an ohmic electrode 32 described below is formed. The electrode contact window 31 may have a recess formed in the doping region of the nitride semiconductor layer 12. Etching can be performed by, for example, chlorine-based plasma etching. Specifically, at least one of $Cl_2$, $BCl_3$, and $SiCl_4$ can be used as etching gas. At this time, since the first opening pattern 24 of the first resist 20 serving as a mask is formed to be greater than the second opening pattern 26 of the second resist 22, the concave portion 30 has a tapered shape which expands toward the surface side. This tapered shape can be referred to as a forward tapered shape. The opening 28 has a tapered shape which expands toward the surface side continuously with the concave portion 30. That is, the sidewall 29 (inner wall) of the electrode contact window 31 has a tapered shape or a slope. Since the materials of the second nitride semiconductor layer 16 and the third nitride semiconductor layer 18 are different, the taper angle may differ between the opening 28 and the concave portion 30. The width (L2 in the drawing) in a horizontal direction of an inclined portion on the sidewall (the sidewall of each of the concave portion 30 and the opening 28) of the electrode contact window 31 may be 0.03 µm to 0.1 µm. The horizontal direction means a direction horizontal to a surface of the substrate 10, and the horizontal direction is along a direction where the sidewall of the electrode contact window 31 is inclined. In the case that the distance L2 is smaller than 0.03 µm, it may be difficult to suppress electric field concentration in the edge portions of the ohmic electrodes 32 described below. In the case that the distance L2 is greater than 0.1 µm, since the distance between the gate electrode and the drain electrode is shortened, a breakdown voltage between both electrodes may be lowered. From above, the distance L2 may be 0.03 µm to 0.07 µm.

Figure 1D:
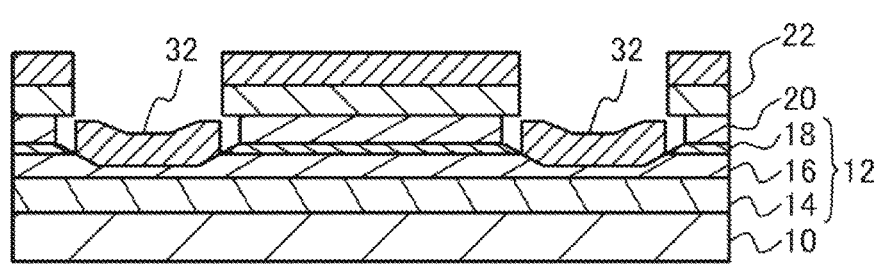

Next, as shown in FIG. 1D, ohmic electrodes 32 (source electrode and drain electrode) are formed with the first resist 20 and the second resist 22 as a mask. At this time, each ohmic electrode 32 is formed at least to the middle of an inclined surface which forms the tapered shape of the concave portion 30 in the second nitride semiconductor layer 16. Accordingly, an inclined surface of the second nitride semiconductor layer 16 and an inclined surface of the third nitride semiconductor layer 18 are exposed and the ohmic electrode 32 is formed thereon. The ohmic electrode 32 may be overlapped with the doping region in the nitride semiconductor layer 12. As the ohmic electrode 32, for example, a metal layer in which aluminum (Al) layer having a thickness of 300 nm is laminated on titanium (Ti) layer having a thickness of 10 nm can be used. Instead of titanium layer, tantalum (Ta) layer having a thickness of 10 nm may be used. The ohmic electrodes 32 can be formed by, for example, a vapor deposition method and lift-off (removing the first resist 20 and the second resist 22).

Figure 2A:
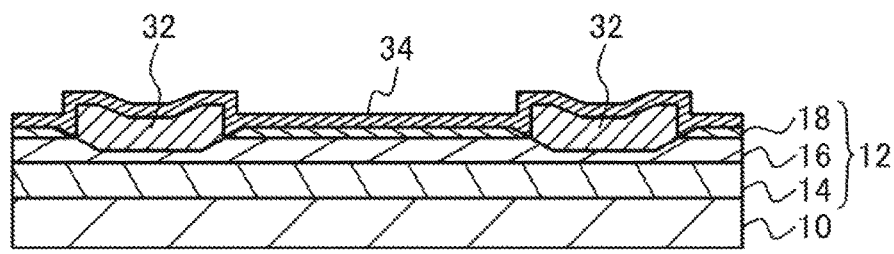
FIGS. 2A to 2D are diagrams (second view) showing the process for manufacturing a semiconductor device according to Example 1.

Next, as shown in FIG. 2A, the first resist 20 and the second resist 22 are lifted off, and an insulating film 34 is formed on the third nitride semiconductor layer 18 and the ohmic electrodes 32. As the insulating film 34, for example, silicon nitride (SiN) film having a thickness of 20 nm can be used. The insulating film 34 is formed on the ohmic electrode 32 (source electrode and drain electrode). The insulating film 34 can be referred to as a passivation layer.

Figure 2B:
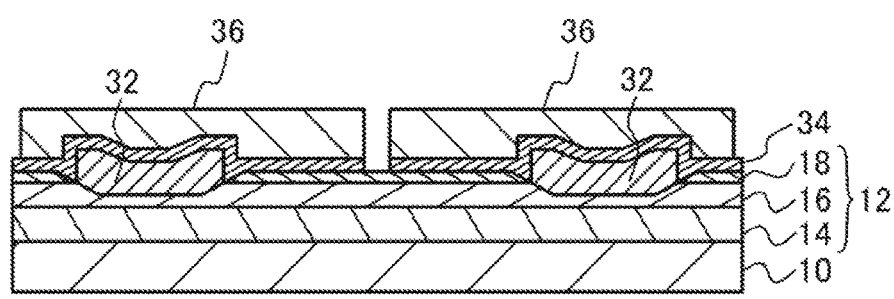

Next, as shown in FIG. 2B, an insulating film 36 is formed on the insulating film 34, and patterning is performed. As the insulating film 36, for example, photoresist can be used, and patterning of the insulating film 36 (opening formation thereof) can be performed by exposure. After patterning is completed, the insulating film 34 is etched with the insulating film 36 as a mask to expose the third nitride semiconductor layer 18.

Figure 2C:
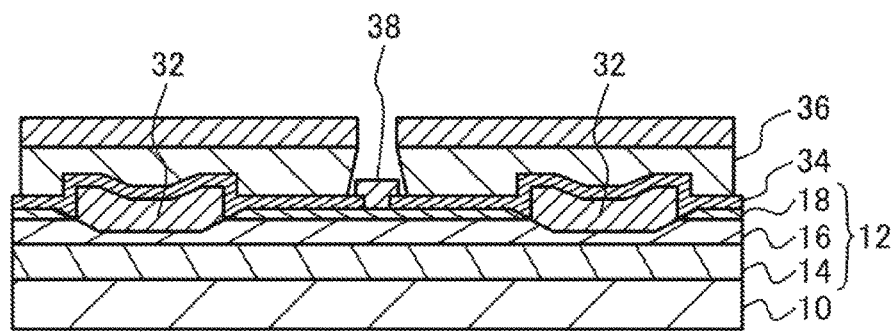

Next, as shown in FIG. 2C, the insulating film 36 is further patterned to expand the opening. Thereafter, a gate electrode 38 is formed with the insulating film 36 as a mask. As the gate electrode 38, for example, a metal layer in which gold (Au) layer having a thickness of 400 nm is laminated on nickel (Ni) layer having a thickness of 50 nm can be used. The gate electrode 38 is located in the opening in the insulating film 34.

Figure 2D:
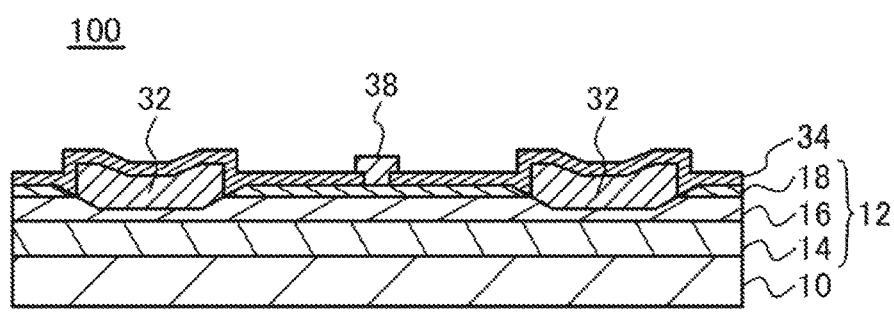

Next, as shown in FIG. 2D, the insulating film 36 is removed, whereby the material of the gate electrode 38 stacked on the insulating film 36 is lifted off. With the above process, a semiconductor device 100 according to Example 1 is completed. The semiconductor device 100 has a structure in which the first nitride semiconductor layer 14 including the electron transit layer, the second nitride semiconductor layer 16 including the electron supply layer, and the third nitride semiconductor layer 18 including the cap layer are laminated on the substrate 10 in this order. The concave portions 30 are formed in the second nitride semiconductor layer 16, and the openings 28 are formed at the positions corresponding to the concave portions 30 in the third nitride semiconductor layer 18. The concave portions 30 and the openings 28 are continuous and have a tapered shape which expands from the first nitride semiconductor layer 14 side toward the opposite side. In the opening 28 and the concave portion 30, the ohmic electrodes 32 are formed to the middle of the inclined surface which forms the tapered shape. That is, the ohmic electrodes 32 are formed in contact with the inner wall 29 of the electrode contact window.

Next, the effects peculiar to the semiconductor device according to Example 1 will be described referring to FIGS. 3A to 3D and 4A to 4D.

Figure 3A:
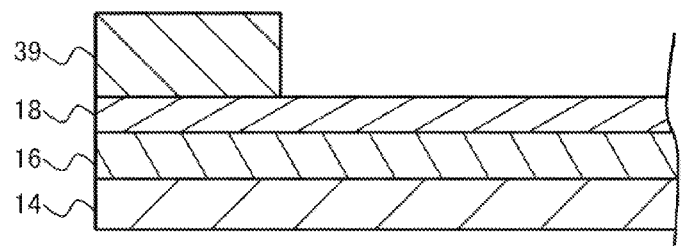
FIGS. 3A to 3D are diagrams showing the details of a process for manufacturing a semiconductor device according to a comparative example.
Figure 3B:
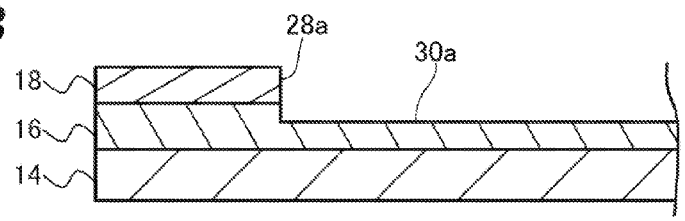
Figure 3C:
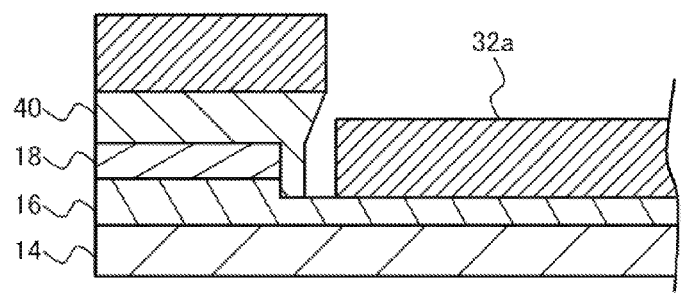
Figure 3D:
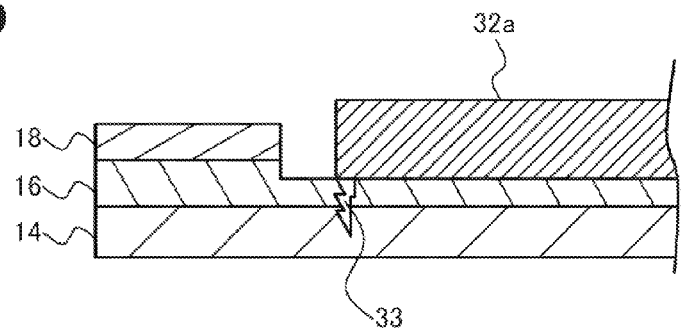
Figure 4A:
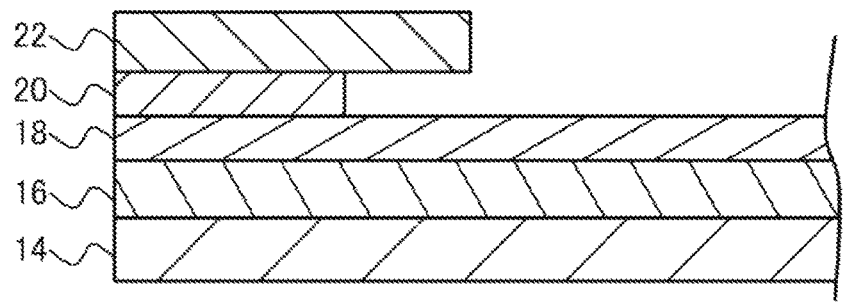
FIGS. 4A to 4D are diagrams showing the details of a process for manufacturing a semiconductor device according to Example 1.
Figure 4B:
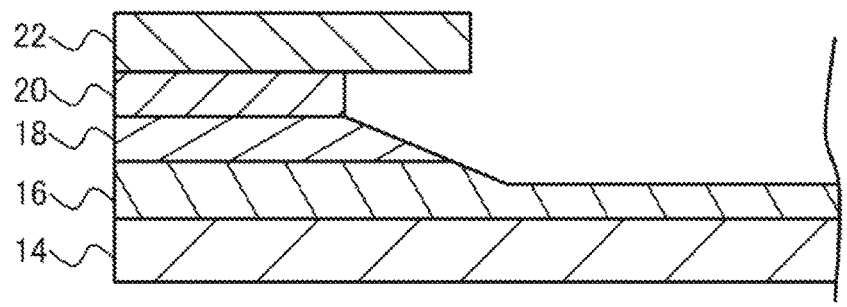
Figure 4C:
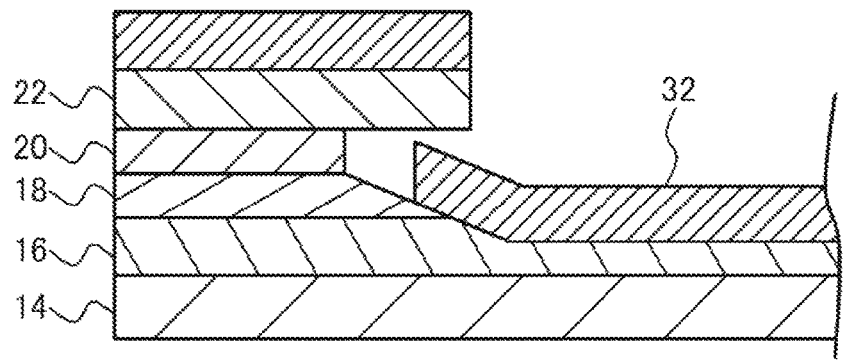
Figure 4D:
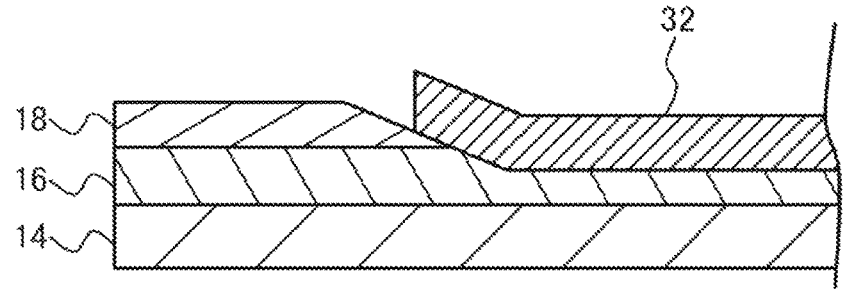

FIGS. 3A to 3D are diagrams showing the details of a process for manufacturing a semiconductor device according to a comparative example, and FIGS. 4A to 4D are diagrams showing the details of a process for manufacturing a semiconductor device according to Example 1. FIGS. 3A to 3D and 4A to 4D are sectional views of a main part around the drain electrode (the right side of the gate electrode) of the ohmic electrodes 32 shown in FIGS. 1B to 1D. As shown in FIGS. 3A to 3D, in the comparative example, resist 39 is used as a mask for etching the third nitride semiconductor layer 18 and the second nitride semiconductor layer 16 to form a recess (FIG. 3A), and anisotropic etching is performed. As a result, unlike Example 1, the sidewalls of the concave portion 30 and the opening 28 are substantially perpendicular to a surface of the second nitride semiconductor layer 16 (FIG. 3B). Then, the drain electrode 32$a$ is formed with resist 40 newly formed and patterned after the removal of the resist 39 as a mask (FIG. 3C), and as a result, the end portion of the drain electrode 32$a$ is located above the second nitride semiconductor layer 16.

In the semiconductor device (FIGS. 3A to 3D) according to the comparative example, an electric field is likely to concentrate on the end portion of the drain electrode 32$a$. The reason for the concentration of the electric field is that the end portion of the drain electrode 32$a$ is closest to an electrode (source electrode or gate electrode) having a potential difference with respect to the drain electrode 32$a$, and the end portion linearly faces the electrode having a potential difference. In the case that an electrode has a portion on which an electric field easily concentrates compared to other portions, the electric field of this portion becomes extremely greater than other portions. As a result, it is hard to withstand a high electric field, electrical conduction destruction occurs in a portion (reference numeral 33) where the end portion of the drain electrode 32$a$ is located, and reliability of the HEMT is degraded. Furthermore, current collapse may occur due to the high electric field, and the characteristics of the HEMT may be deteriorated.

In contrast, in the semiconductor device (FIGS. 4A to 4D) according to Example 1, the ohmic electrode 32 (drain electrode 32) is provided in contact with the tapered inner wall of the electrode contact window. Specifically, the ohmic electrode 32 is formed so as to extend to the third nitride semiconductor layer 18 exposed on the inner wall. In this case, the end portion and the bottom surface of the drain electrode 32 faces the electrode (source electrode or gate electrode) having a potential difference. Unlike the comparative example, since the drain electrode 32 faces the electrode having a potential difference on the surface instead of the linear end portion, electric field concentration on the drain electrode 32 is relaxed. Furthermore, the bottom surface of the drain electrode 32 is away from the end portion of the drain electrode 32, gradually separated from the electrode having a potential difference. For this reason, an electric field which is applied to the drain electrode 32$a$ is gradually relaxed on the bottom surface of the drain electrode 32, and electric field concentration is further relaxed. As a result, the occurrence of a high electric field in the end portion of the ohmic electrode 32 (drain electrode 32) is suppressed, thereby suppressing electrical conduction destruction. The occurrence of a high electric field is suppressed, thereby suppressing the occurrence of current collapse. The cap layer (GaN) included in the third nitride semiconductor layer 18 has a smaller number of traps than the electron supply layer (AlGaN) included in the second nitride semiconductor layer 16. For this reason, when the end portion of the ohmic electrode (drain electrode) is located in the cap layer (GaN), it is possible to further suppress the occurrence of electrical conduction destruction and collapse.

As described above, according to the semiconductor device of Example 1, the occurrence of electrical conduction destruction and collapse in the end portion of the ohmic electrode (drain electrode) is suppressed, thereby achieving improvement of the characteristics and reliability of the HEMT. That is, in the semiconductor device using the nitride semiconductor, it is possible to suppress failure due to a high electric field generated on the ohmic electrodes and to improve apparatus characteristics and reliability.

Figure 5A:
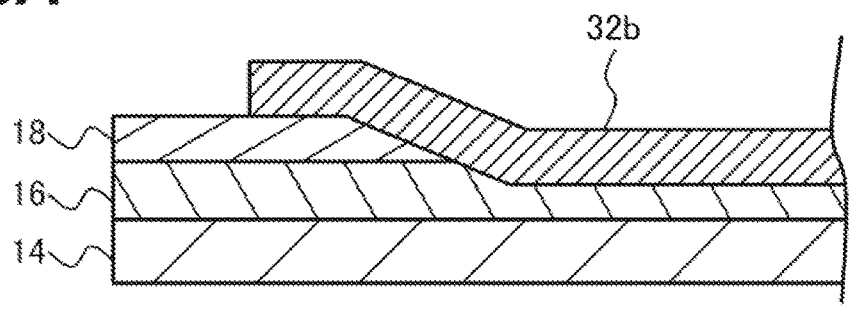
FIGS. 5A to 5C are diagrams showing a process for manufacturing a semiconductor device according to a modification example of Example 1.
Figure 5B:
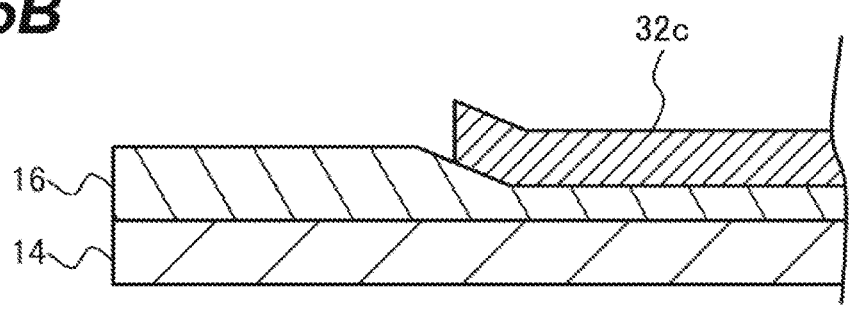
Figure 5C:
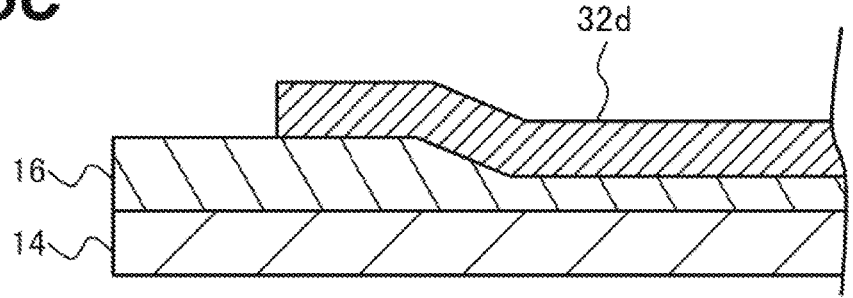

Next, a modification example of Example 1 will be described. FIGS. 5A to 5C are diagrams showing a semiconductor device according to a modification example of Example 1, and show a portion corresponding to the drain electrode 32$a$ shown in FIG. 1D.

In Example 1, although an example where the end portion of the ohmic electrode 32 (drain electrode 32) is formed to the tapered inner wall (the middle of the inclined surface of the opening 28 in the third nitride semiconductor layer 18) of the electrode contact window has been described, the ohmic electrode 32$b$ may be formed to the surface of the third nitride semiconductor layer 18 (FIG. 5A).

In Example 1, although a case where the HEMT includes the cap layer (third nitride semiconductor layer 18) has been described as an example, a structure in which no cap layer is provided may be made (FIG. 5B). In this case, the drain electrode 32$c$ is formed at least to the middle of the inclined surface of the concave portion 30 in the second nitride semiconductor layer 16, thereby suppressing the occurrence of electrical conduction destruction and collapse. Similarly to FIG. 5A, a configuration in which the drain electrode 32$d$ is located on a top surface of the second nitride semiconductor layer 16 may be made (FIG. 5C).

In Example 1, the first resist 20 and the second resist 22 having different sensitivities are exposed in the same pattern, and the overhang mask is formed due to the difference in sensitivity. As means for forming the opening of the underlying resist (the first resist 20) greater than that of overlying resist (the second resist 22), in addition, patterning may be performed by development such that the underlying resist (first resist 20) is recessed from the overlying resist (second resist 22). A method may be used in which an inorganic insulating film (for example, SiO, SiON, SiN, or the like) is used as the underlying mask instead of the first resist 20, isotropic wet etching is carried out, and side etching proceeds to recess the underlying layer.

Example 2

Example 2 is an example where single-layer resist is used in a process for forming an opening in a second nitride semiconductor layer.

Figure 6A:
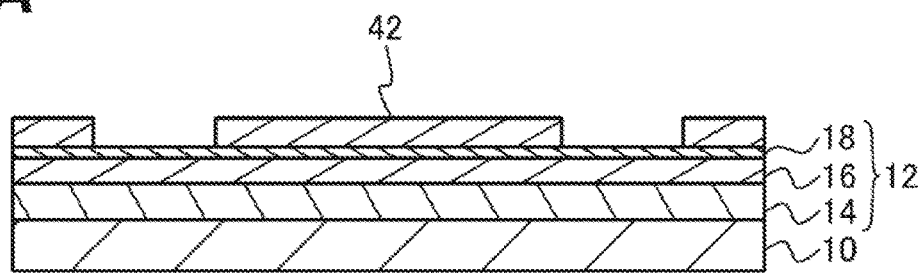
FIGS. 6A and 6B are diagrams showing a process for manufacturing a semiconductor device according to Example 2.
Figure 6B:
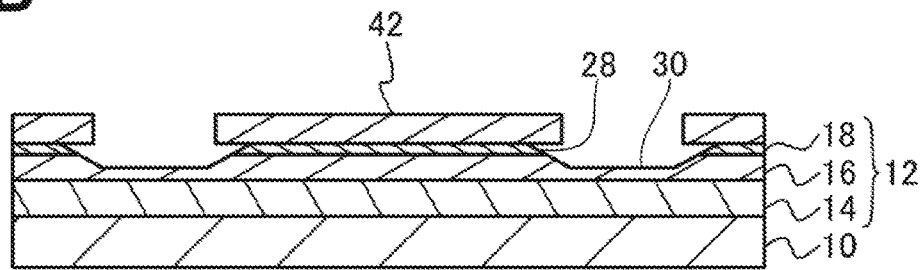

FIGS. 6A and 6B are diagrams showing a process for manufacturing a semiconductor device according to Example 2, and correspond to the etching process shown in FIGS. 1B and 1C. Other processes are the same as those in Example 1, thus description thereof will not be repeated.

First, as shown in FIG. 6A, resist 42 is formed on the third nitride semiconductor layer 18, and patterning is performed in conformity with the shapes of the ohmic electrodes (source electrode and drain electrode). Next, as shown in FIG. 6B, the third nitride semiconductor layer 18 and the second nitride semiconductor layer 16 are isotropically etched with the resist 42 as a mask. With this process, the opening 28 is formed in the third nitride semiconductor layer 18, the concave portion 30 is formed in the second nitride semiconductor layer 16, and the concave portion 30 and the opening 28 have a tapered shape which expands toward the surface side.

As the isotropic etching method, isotropic dry etching can be used. Specifically, as in Example 1, chlorine-based plasma etching can be used. At this time, in order to increase isotropy, control is carried out such that a gas pressure increases (for example, equal to or higher than 1 Pa) and a bias voltage decreases (for example, equal to or lower than 10 V). After the etching process is completed, the ohmic electrodes may be formed with the resist 42 as a mask, or the ohmic electrodes may be formed with a new mask after the resist is separated once.

Figure 7A:
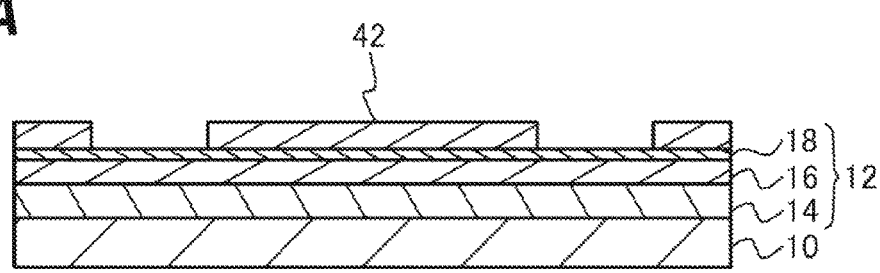
FIGS. 7A to 7C are diagrams showing a process for manufacturing a semiconductor device according to a modification example of Example 2.
Figure 7B:
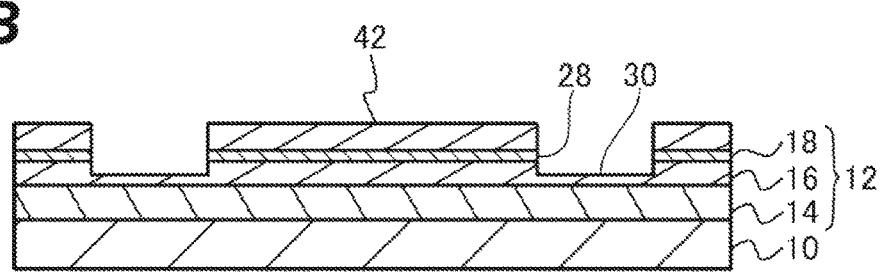
Figure 7C:
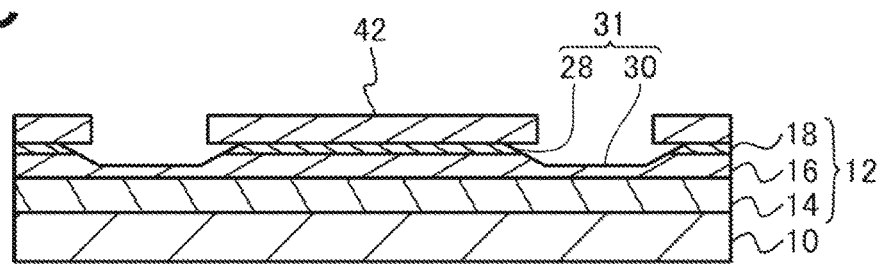

FIGS. 7A to 7C are diagrams showing a method of manufacturing a semiconductor device according to a modification example of Example 2, and correspond to the process for forming an ohmic electrode shown in FIGS. 6A and 6B. First, as shown in FIG. 7A, the resist 42 is formed on the third nitride semiconductor layer 18, and a photolithography process is carried out in conformity with the shape of the ohmic electrode. Next, as shown in FIG. 7B, the third nitride semiconductor layer 18 and the second nitride semiconductor layer 16 are etched with the resist 42 as a mask, and the opening 28 and the concave portion 30 are formed. At this time, unlike Example 2 (FIGS. 6A and 6B), etching is performed by anisotropic dry etching. As a result, the sidewalls of the opening 28 and the concave portion 30 are perpendicular to the surface of the second nitride semiconductor layer 16.

Next, as shown in FIG. 7C, second etching is performed to form the opening 28 and the concave portion 30 in a tapered shape. As the second etching for forming the tapered shape, for example, wet etching can be used. As an etchant, for example, potassium hydroxide or sodium hydroxide can be used. In this way, even when a single-layer resist is used, as in Example 1, it is possible to form the electrode contact window 31 (opening 28 and the concave portion 30) having the tapered shape.

According to the semiconductor device of Example 2 and the modification example, since the drain electrode is provided in contact with the tapered inner wall of the electrode contact window 31, it is possible to suppress the occurrence of electrical conduction destruction and current collapse. As a result, it is possible to achieve improvement of the characteristics and reliability of the HEMT. In Example 2, as in Example 1, a configuration in which the ohmic electrode 32 is located on a top surface of the third nitride semiconductor layer 18 (see FIG. 5A) or a configuration no cap layer is provided (see FIGS. 5B and 5C) may be provided.

In Examples 1 and 2, although SiC substrate is used as the substrate 10, in addition, Si substrate, GaN substrate, sapphire substrate, or the like may be used. Although AlGaN layer is used as the second nitride semiconductor layer 16 (electron supply layer), in addition, InAlN layer or the like may be used. As the semiconductor layer included in the nitride semiconductor layer 12, in addition, InN layer, AN layer, InGaN layer, AlInGaN layer, or the like may be used depending on a desired function. In Examples 1 and 2, although a configuration is made in which the drain electrode 32 is in contact with the tapered inner wall of the electrode contact window, the source electrode may have the same configuration or a configuration different from the drain electrode 32.

Although the examples of the invention have been described in detail, the invention is not limited to the specific examples, and various modifications and alterations may be made without departing from the subject matter of the invention described in the appended claims.

What is claimed is:

1. A method of manufacturing a semiconductor device, the method comprising:
    forming a semiconductor layer on a substrate;
    forming a first resist on the semiconductor layer;
    forming a second resist on the first resist;
    forming a first opening pattern of the first resist and a second opening pattern of the second resist, the first opening pattern and the second opening pattern being overlapped with each other;
    performing isotropic etching on the semiconductor layer through the first opening pattern and the second opening pattern so as to form a recess on a surface of the semiconductor layer, the recess having a slanted slope; and
    forming an electrode on the recess of the semiconductor layer which is exposed from the first opening pattern and the second opening pattern.

2. The method according to claim 1,
    wherein the semiconductor layer is formed by an electron transit layer on the substrate, an electron supply layer on the electron transit layer, and a cap layer on the electron supply layer, and
    wherein a bottom of the recess is formed at a surface of the electron supply layer.

3. The method according to claim 2,
    wherein the electron transit layer includes GaN, the electron supply layer includes AlGaN or InAlN, and the cap layer includes GaN.

4. The method according to claim 2,
    wherein the electrode is formed so as to be in contact with the bottom and the slanted slope of the recess in the forming of the electrode.

5. The method according to claim 1,
    wherein the electrode is a source electrode or a drain electrode.

6. The method according to claim 1,
    wherein a size of the first opening is greater than that of the second opening.

7. The method according to claim 1,
    wherein the performing of the isotropic etching is conducted after performing anisotropic etching on the semiconductor layer through the first opening pattern and the second opening pattern.

8. The method according to claim 7,
wherein any of $Cl_2$, $BCl_3$, and $SiCl_4$ is used for the isotropic etching and the anisotropic etching.

9. The method according to claim 7,
wherein the isotropic etching is wet etching, and
wherein potassium hydroxide or sodium hydroxide is used for the wet etching.

\* \* \* \* \*